United States Patent
Poplevine et al.

(10) Patent No.: US 8,213,227 B2
(45) Date of Patent: Jul. 3, 2012

(54) 4-TRANSISTOR NON-VOLATILE MEMORY CELL WITH PMOS-NMOS-PMOS-NMOS STRUCTURE

(75) Inventors: Pavel Poplevine, Burlingame, CA (US); Ernes Ho, Sunnyvale, CA (US); Hengyang (James) Lin, San Ramon, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 250 days.

(21) Appl. No.: 12/751,012

(22) Filed: Mar. 31, 2010

(65) Prior Publication Data

US 2011/0242898 A1  Oct. 6, 2011

(51) Int. Cl.
G11C 16/04 (2006.01)
G11C 11/34 (2006.01)
(52) U.S. Cl. ......... 365/185.01; 365/185.05; 365/185.18; 365/185.28
(58) Field of Classification Search ............. 365/185.01, 365/185.05, 185.18, 185.28
See application file for complete search history.

(56) References Cited

U.S. PATENT DOCUMENTS

| | | | |
|---|---|---|---|
| 5,646,885 A | 7/1997 | Matsuo et al. | 365/185.05 |
| 6,137,723 A | 10/2000 | Bergemont et al. | 365/185.18 |
| 6,903,978 B1 | 6/2005 | Mirgorodski et al. | 365/185.28 |
| 6,985,386 B1 * | 1/2006 | Mirgorodski et al. | 365/185.05 |
| 6,992,927 B1 | 1/2006 | Poplevine et al. | 365/185.05 |
| 7,042,763 B1 | 5/2006 | Mirgorodski et al. | 365/185.05 |
| 7,164,606 B1 | 1/2007 | Poplevine et al. | 365/185.28 |
| 7,167,392 B1 * | 1/2007 | Poplevine et al. | 365/185.08 |
| 7,209,392 B2 * | 4/2007 | Chen et al. | 365/185.26 |
| 7,239,558 B1 | 7/2007 | Poplevine et al. | 365/188 |
| 7,391,647 B2 * | 6/2008 | Fang et al. | 365/185.18 |
| 2002/0041000 A1 | 4/2002 | Watanabe et al. | 257/369 |
| 2009/0154248 A1 | 6/2009 | Noda | 365/185.18 |

* cited by examiner

Primary Examiner — Hoai V Ho
Assistant Examiner — Tri Hoang
(74) Attorney, Agent, or Firm — Wade J. Brady, III; Frederick J. Telecky, Jr.

(57) ABSTRACT

A non-volatile memory (NVM) cell structure comprises a PMOS program transistor having source, drain and bulk region electrodes and a gate electrode that is connected to a data storage node; an NMOS control transistor having source, drain and bulk region electrodes that are commonly-connected to receive a control voltage and a gate electrode that is connected to the data storage node; a PMOS erase transistor having source, drain and bulk region electrodes that are commonly-connected to receive an erase voltage and a gate electrode that is connected to the data storage node; and an NMOS read transistor having source, drain and bulk region electrodes and a gate electrode connected to the data storage node.

7 Claims, 3 Drawing Sheets

4-TRANSISTOR NON-VOLATILE MEMORY CELL WITH PMOS-NMOS-PMOS-NMOS STRUCTURE

FIELD OF THE INVENTION

The present invention relates to integrated circuit memory devices and, in particular, to a 4-transistor non-volatile memory (NVM) cell that utilizes a PMOS-NMOS-PMOS-NMOS structure to significantly reduce cell area and provide for very small programming current through utilization of reverse Fowler-Nordheim tunneling programming.

BACKGROUND OF THE INVENTION

U.S. Pat. No. 7,164,606 B1, which issued on Jan. 16, 2007, to Poplevine et al., discloses an all PMOS 4-transistor non-volatile memory (NVM) cell that utilizes reverse Fowler-Nordheim tunneling for programming. U.S. Pat. No. 7,164,606 is hereby incorporated by reference herein in its entirety to provide background information regarding the present invention.

Referring to FIG. 1, as disclosed in U.S. Pat. No. 7,164,606, in accordance with the method of programming an NVM array that includes all-PMOS 4-transistor NVM cells having commonly-connected floating gates, for each cell 100 in the array that is to be programmed, all of the electrodes of the cell are grounded. Then, an inhibiting voltage $V_N$ is applied to the bulk-connected source region $V_r$ of the cell's read transistor $P_r$, to the commonly-connected drain, bulk and source regions $V_e$ of the cell's erase transistor $P_e$, and to the drain region $D_r$ of the read transistor $P_r$. The source region $V_p$ and the drain region $D_p$ of the cell's programming transistor $P_w$ are grounded. The bulk $V_{nw}$ of the programming transistor $P_w$ is optional; it can be grounded or it can remain at the inhibiting voltage $V_N$. For all cells in the NVM array that are not selected for programming, the inhibiting voltage $V_N$ is applied to the $V_r$, $V_e$ and $D_r$ electrodes and is also applied to the $V_p$, $D_p$ and $V_{nw}$ electrodes. The control gate voltage $V_c$ of the cell's control transistor $P_c$ is then swept from 0V to a maximum programming voltage $V_{cmax}$ in a programming time $T_{prog}$. The control gate voltage $V_c$ is then ramped down from the maximum programming voltage $V_{cmax}$ to 0V. All electrodes of the cell and the inhibiting voltage $V_N$ are then returned to ground.

The all-PMOS 4-transistor NVM cell programming technique disclosed in the '606 patent provides advantages of both low current consumption, allowing the ability to simultaneously program a large number of cells without the need for high current power sources, and a simple program sequence. However, the 4-transistor all-PMOS NVM cell occupies a relatively large area. Thus, it would be highly desirable to have available an NVM cell having reduced area, but that maintains the benefits of low programming current.

SUMMARY OF THE INVENTION

An embodiment of the present invention provides a 4-transistor non-volatile memory (NVM) cell having a PMOS-NMOS-PMOS-NMOS structure that comprises a PMOS program transistor having source, drain and bulk region electrodes and a gate electrode connected to a data storage node, an NMOS control transistor having source, drain and bulk region electrodes that are commonly-connected to receive a control voltage and a gate electrode connected to the data storage node, a PMOS erase transistor having source, drain and bulk region electrodes that are commonly-connected to receive an erase voltage and a gate electrode that is connected to the data storage node, and an NMOS read transistor having source, drain and bulk region electrodes and a gate electrode connected to the data storage node.

The features and advantages of the various aspects of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 2:
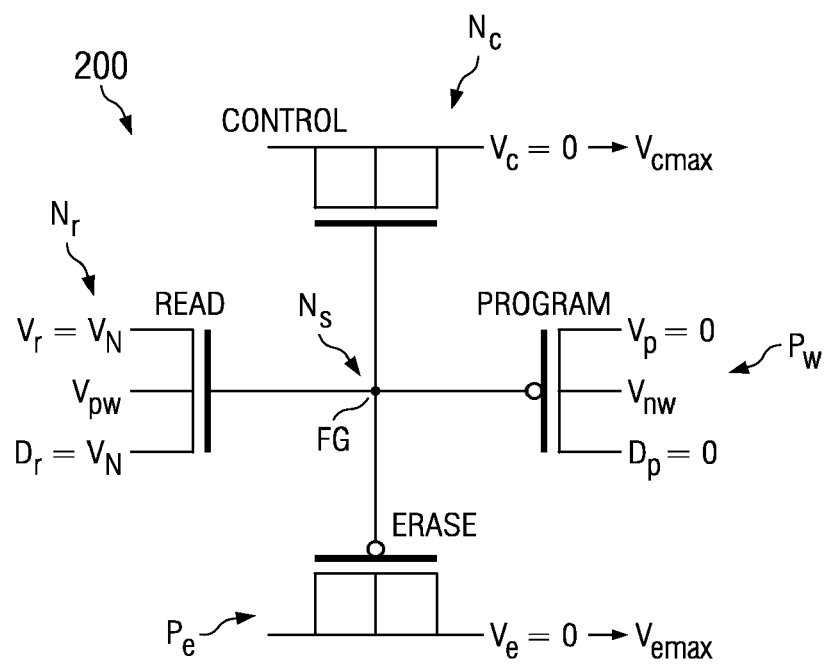
FIG. 2 is a schematic drawing illustrating an embodiment of a PMOS-NMOS-PMOS-NMOS 4-transistor NVM cell in accordance with the concepts of the present invention.

FIG. 2 shows an embodiment of a non-volatile memory (NVM) cell structure 200 in accordance with the concepts of the present invention. The NVM cell structure 200 includes a PMOS control transistor $P_w$ having source, drain and bulk region electrodes and a gate electrode that is connected to a data storage node FG; an NMOS control transistor $N_c$ having source, drain and bulk region electrodes that are commonly-connected to receive a control voltage $V_c$ and a gate electrode that is connected to the data storage node FG; a PMOS erase transistor $P_e$ having source, drain and bulk region electrodes that are commonly-connected to receive an erase voltage $V_e$ and a gate electrode connected to the data storage node FG; and an NMOS read transistor $N_r$ having source, drain and bulk region electrodes and a gate electrode connected to the data storage node.

Figure 1:
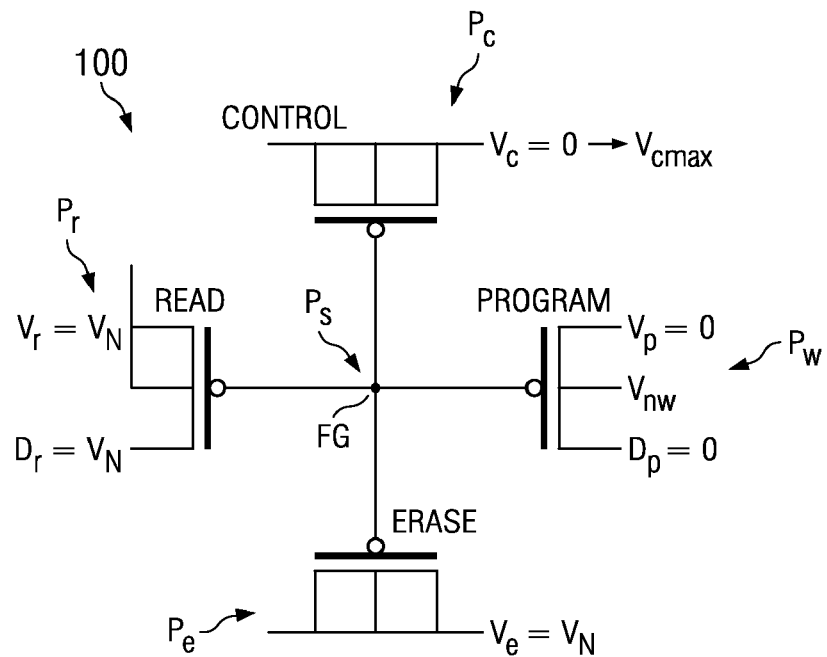
FIG. 1 is a schematic drawing illustrating an all-PMOS, 4-transistor NVM cell.
Figure 3:
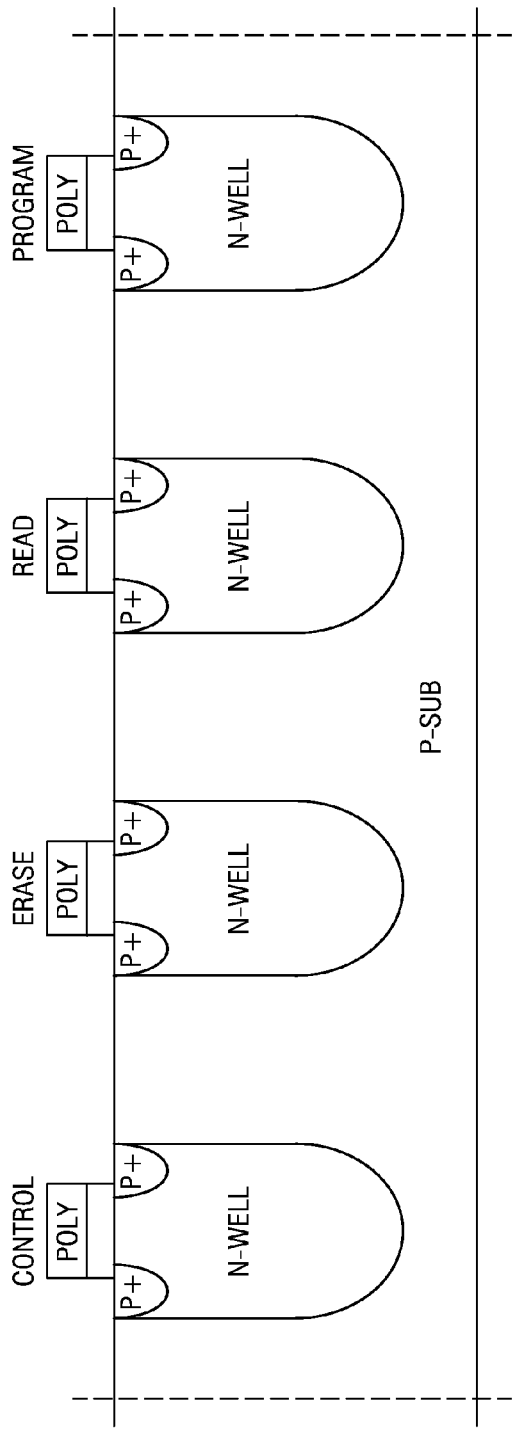
FIG. 3 is a cross-section drawing illustrating the layout of the FIG. 1 all-PMOS, 4-transistor NVM cell.
Figure 4:
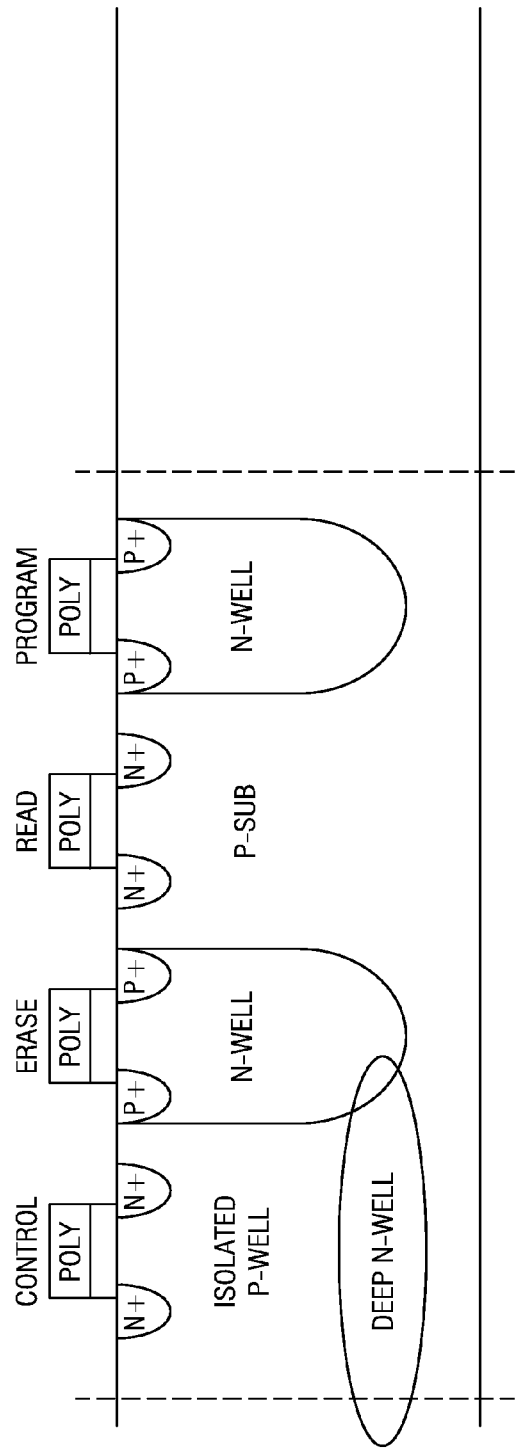
FIG. 4 is a cross-section drawing illustrating an embodiment of a layout of the FIG. 2 PMOS-NMOS-PMOS-NMOS 4-transistor NVM cell.
Figure 5:
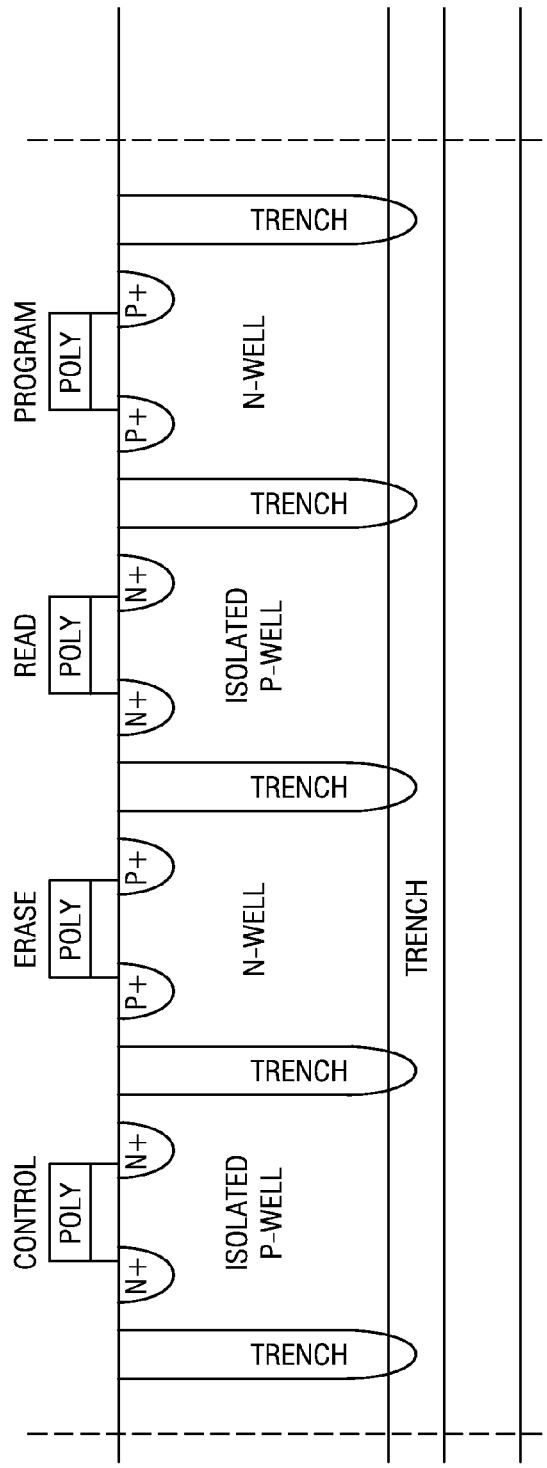
FIG. 5 is a cross-section drawing illustrating an alternate embodiment of a layout of the FIG. 2 PMOS-NMOS-PMOS-NMOS 4-transistor NVM cell.
Figure 6:
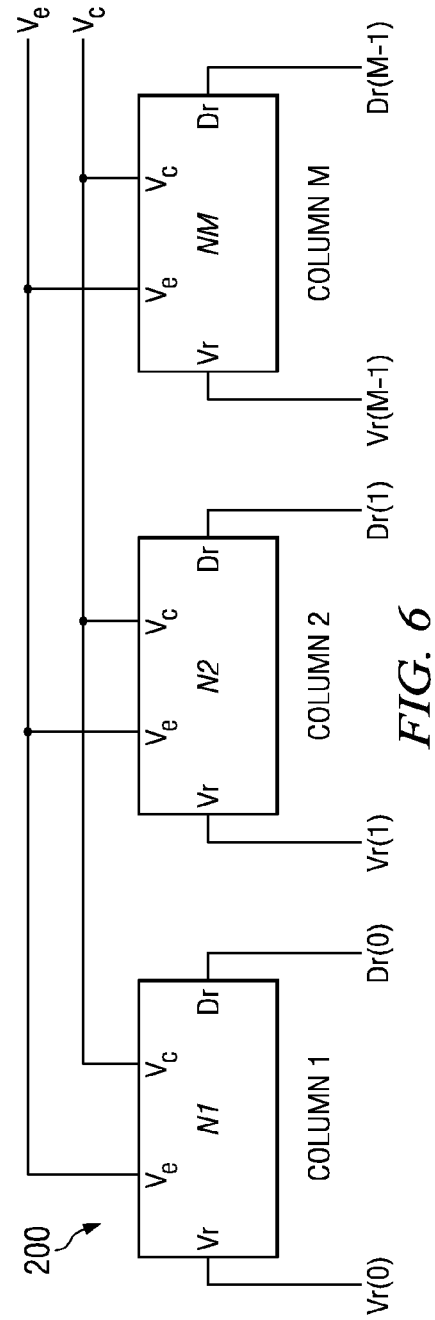
FIG. 6 is a block diagram illustrating a plurality of NVM cells 200 in an NVM cell array row.

With reference to FIGS. 1 and 2, the present inventions provides for changing the FIG. 1 all-PMOS, 4-transistor NVM cell 100 into the FIG. 2 PMOS-NMOS-PMOS-NMOS 4-transistor NVM cell, with the control and read transistors changed from PMOS to NMOS while maintaining all of the electrodes the same. By using a deep N-well to form isolated P-wells, as shown in FIG. 4, the $V_c$ electrode of the NMOS control transistor $N_c$ can be ramped up to a maximum high voltage $V_{cmax}$ to allow reverse Fowler-Nordheim tunneling to occur without problem. As shown in FIGS. 3 and 4, in comparison with the layout of the all-PMOS 4-transistor NVM cell 100 (FIG. 3), the NVM cell structure 200 results in very compact layout area (FIG. 4) by placing two NMOS transistors, i.e. control transistor $N_c$ and read transistor $N_r$, in between the required spacing of the N-wells of the two PMOS transistors, i.e., program transistor $P_w$ and erase transistor $P_e$, thereby reducing the required spacings between them, which is often large. The NMOS-PMOS-NMOS-PMOS NVM cell structure 200 can also be realized utilizing different methods of isolation to create separated N-wells and P-wells for each of the four transistors, for example by using isolation trench techniques as shown in FIG. 5. At the same time, the method and sequence of programming, erasing and reading are almost identical to those of the FIG. 1 all-PMOS NVM cell 100, thereby retaining all of the advantages of the reverse Fowler-Nordheim tunneling programming method. FIG. 6 shows the structure of a plurality of NVM cells 200 in a memory array row.

Referring to FIG. 2 and to FIG. 6, a summary of the program, erase and read sequences for the FIG. 2 NVM cell 200 in an array row is as follows:

Program Sequence

Set all electrodes to 0V. For all NVM cells 200 in the array row selected for programming, set the source electrode voltage $V_r$ and the drain electrode voltage $D_r$ of the NMOS read transistor $N_r$ to an inhibiting voltage $V_N$. Set the source electrode voltage $V_p$ and the drain electrode voltage $D_p$ of the PMOS program transistor $P_w$ to 0V. The bulk region electrode voltage $V_{nw}$ of the PMOS program transistor $P_w$ can be set to either the inhibiting voltage $V_N$ or 0V. The bulk region electrode voltage $V_{pw}$ of the NMOS read transistor $N_r$ is set to 0V if using the common P-Sub NMOS shown in FIG. 4 or can be set to either the inhibiting voltage $V_N$ or 0V if using the isolation trench scheme shown in FIG. 5. For all NVM cells 200 in the array row that are not selected for programming, the $V_r$, $D_r$, $V_p$, $D_p$ and $V_{nw}$ voltages are set to the inhibiting voltage $V_N$. The $V_{pw}$ voltage is set to 0V if using the FIG. 4 layout or can be set to either the inhibiting voltage $V_N$ or 0V of using the FIG. 5 layout. The control voltage is then ramped up from 0V to a predefined maximum control voltage $V_{cmax}$ and the erase voltage is ramped up from 0V to a predefined maximum erase voltage $V_{emax}$ and both levels are held for the duration of a predefined program time $T_{prog}$; the erase voltage $V_e$ is ramped up along with the control voltage $V_c$ in order to prevent forward biasing the PN diode that is formed between the isolated P-well and the N-well. At the end of the program time $T_{prog}$, the control voltage $V_c$ is ramped down from the maximum program voltage $V_{emax}$ to 0V and the erase voltage $V_e$ is ramped down from the maximum erase voltage $V_{emax}$ to 0V. All electrodes with the inhibiting voltage $V_N$ are then returned to 0V to complete the program sequence.

Erase Condition

Ramp up the erase voltage $V_e$ from 0V to the maximum erase voltage $V_{emax}$, hold it for the duration of a predefine erase time $T_{erase}$, and ramp the erase voltage back down from the maximum erase voltage $V_{emax}$ to 0V. All other cell electrodes are set to 0V.

Read Condition

Set the source electrode voltage $V_r$ of the NMOS read transistor $N_r$ to about 1V (i.e., sufficient enough voltage to be able to read the cell current while preventing disturb to the programmed cells). All other electrodes of the cell are set to 0V.

Those skilled in the art will appreciate that the voltage levels utilized in the program, erase and read operations will depend upon the thickness of the gate oxide utilized in the NMOS and PMOS devices of the NVM cell 200. For example, for a gate oxide thickness of 60-80 Å, $V_N \sim =3.3V$, $V_{cmax}=V_{emax}\sim=10V$, with $T_{prog}=T_{erase}\sim=20$-50 milliseconds. For gate oxide thickness of 120 Å, $V_N \sim =5.0V$, $V_{cmax}=V_{emax}\sim=16V$, with $T_{prog}=T_{erase}\sim=20$-50 milliseconds.

It should be understood that the particular embodiments of the invention described above have been provided by way of example and that other modifications may occur to those skilled in the art without departing from the scope of the invention as expressed in the appended claims and their equivalents.

What is claimed is:

1. A non-volatile memory (NVM) cell structure comprising:
   a PMOS program transistor having source, drain and bulk region electrodes and a gate electrode connected to a data storage node;
   an NMOS control transistor having source, drain and bulk region electrodes that are commonly-connected to receive a control voltage and a gate electrode connected to the data storage node;
   a PMOS erase transistor having source, drain and bulk region electrodes that are commonly-connected to receive an erase voltage and a gate electrode connected to the data storage node; and
   an NMOS read transistor having source, drain and bulk region electrodes and a gate electrode connected to the data storage node.

2. A method of programming a non-volatile memory (NVM) cell, the NVM cell including a PMOS program transistor having source, drain and bulk region electrodes and a gate electrode connected to a data storage node; an NMOS control transistor having source, drain and bulk region electrodes that are commonly-connected to receive a control voltage and a gate electrode connected to the data storage node; a PMOS erase transistor having source, drain and bulk region electrodes that are commonly-connected to receive an erase voltage and a gate electrode connected to the data storage node; and an NMOS read transistor having source, drain and bulk region electrodes and a gate electrode connected to the data storage node, the NVM cell programming method comprising:
   setting all electrodes to 0V;
   setting the source and drain electrodes of the NMOS read transistor to an inhibiting voltage;
   setting the source and drain electrodes of the PMOS program transistor to 0V;
   setting the bulk region electrode of the PMOS program transistor to either the inhibiting voltage or 0V;
   setting the bulk region electrode of the NMOS read transistor to either 0V or the inhibiting voltage;
   ramping up the control voltage from 0V to a predefined maximum control voltage and the erase voltage from 0V to a predefined maximum erase voltage for a predefined programming time;
   ramping down the control voltage from the maximum control voltage to 0V and the erase voltage form the maximum erase voltage to 0V; and
   returning all electrodes having the inhibiting voltage to 0V.

3. The method of claim 2, wherein the inhibiting voltage is about 3.3V.

4. The method of claim 2, wherein the inhibiting voltage is about 5.0V.

5. A method of programming a non-volatile memory (NVM) cell array row that includes a plurality of NVM cells, each NVM cell in the array row including a PMOS program transistor having source, drain and bulk region electrodes and a gate electrode connected to a data storage node; an NMOS control transistor having source, drain and bulk region electrodes that are commonly-connected to receive a control voltage and a gate electrode connected to the data storage node; a PMOS erase transistor having source, drain and bulk region electrodes that are commonly-connected to receive an erase voltage and a gate electrode that is connected to the data storage node; and an NMOS read transistor having source, drain and bulk region electrodes connected to the data storage node, the NVM cell array programming method comprising:

for each NVM cell in the array row, setting all electrodes to 0V;

for each NVM cell in the array row selected to be programmed, setting the source and drain electrodes of the NMOS read transistor to an inhibiting voltage, the source and drain electrodes of the PMOS program transistor to 0V, the bulk region electrode of the PMOS program transistor to either the inhibiting voltage or 0V, and the bulk region electrode of the NMOS read transistor to either 0V or the inhibiting voltage;

for each NVM cell in the array row not selected to be programmed, setting the source and drain electrodes of the NMOS read transistor and the source, drain and bulk region electrodes of the PMOS program transistor to the inhibiting voltage and the bulk region electrode of the NMOS read transistor to either 0V or the inhibiting voltage;

ramping up the control voltage from 0V to a predefined maximum control voltage and the erase voltage from 0V to a predetermined maximum erase voltage for a predefined programming time;

ramping down the control voltage from the maximum control voltage to 0V and the erase voltage from the maximum erase voltage to 0V; and for each NVM cell in the array row, returning all electrodes having the inhibiting voltage to 0V.

6. The method of claim 5, wherein the inhibiting voltage is about 3.3V.

7. The method of claim 5, wherein the inhibiting voltage is about 5.0V.

* * * * *